(12) United States Patent
Qiu

(10) Patent No.: US 11,016,139 B2
(45) Date of Patent: May 25, 2021

(54) TEST ASSEMBLY AND TEST DEVICE

(71) Applicants: CHONGQING HKC OPTOELECTRONICS TECHNOLOGY CO., LTD., Chongqing (CN); HKC CORPORATION LIMITED, Guangdong (CN)

(72) Inventor: Tianhui Qiu, Chongqing (CN)

(73) Assignees: CHONGQING HKC OPTOELECTRONICS TECHNOLOGY CO., LTD., Chongqing (CN); HKC CORPORATION LIMITED, Guangdong (CN)

( * ) Notice: Subject to any disclaimer, the term of this patent is extended or adjusted under 35 U.S.C. 154(b) by 102 days.

(21) Appl. No.: 16/312,578

(22) PCT Filed: Oct. 24, 2018

(86) PCT No.: PCT/CN2018/111645
§ 371 (c)(1),
(2) Date: Dec. 21, 2018

(87) PCT Pub. No.: WO2020/052003
PCT Pub. Date: Mar. 19, 2020

(65) Prior Publication Data
US 2020/0088782 A1    Mar. 19, 2020

(30) Foreign Application Priority Data
Sep. 14, 2018   (CN) .......................... 201811072787.7

(51) Int. Cl.
*G01R 31/26*    (2020.01)
*H01L 21/66*    (2006.01)
(Continued)

(52) U.S. Cl.
CPC ......... *G01R 31/2621* (2013.01); *G09G 3/006* (2013.01); *H01L 22/32* (2013.01); *G05D 17/02* (2013.01); *G06T 7/55* (2017.01)

(58) Field of Classification Search
CPC ........... G01L 1/16; G01R 1/067; G01R 31/28; G01R 31/44; G01R 31/2621; G05D 15/01;
(Continued)

(56) References Cited

U.S. PATENT DOCUMENTS

2015/0255527 A1*  9/2015  Oooka ................... G09G 3/006
                                                              257/88

FOREIGN PATENT DOCUMENTS

CN       102788888 A      11/2012
CN       204116980 U       1/2015
(Continued)

OTHER PUBLICATIONS

Machine Translate CN205786887 U (Year: 2016).*
(Continued)

*Primary Examiner* — Melissa J Koval
*Assistant Examiner* — Courtney G McDonnough
(74) *Attorney, Agent, or Firm* — Westbridge IP LLC

(57) ABSTRACT

The present application provides a test assembly, including: a detection pin (11), a pressure sensor (12) connected to the detection pin (11), and a drive mechanism (18) configured to drive each detection pin (11), and each pressure sensor (12) is configured to detect the pressure applied to the detection pin (11) in real time.

3 Claims, 3 Drawing Sheets

(51) Int. Cl.
*G09G 3/00* (2006.01)
*G06T 7/55* (2017.01)
*G05D 17/02* (2006.01)

(58) Field of Classification Search
CPC .............. G05D 17/02; G06T 7/0004; G06T 2207/30121; G06T 7/55; G09G 3/006; H01L 22/32
USPC .................................................. 324/762.09
See application file for complete search history.

(56) References Cited

FOREIGN PATENT DOCUMENTS

| | | | |
|---|---|---|---|
| CN | 204178078 U | 2/2015 | |
| CN | 105093088 A | 11/2015 | |
| CN | 205786887 U | 12/2016 | |
| CN | 207396556 U | 5/2018 | |
| KR | 20070121286 A | * 12/2007 | ............... G02F 1/13 |

OTHER PUBLICATIONS

Machine Translate KR 20070121286 A (Year: 2007).*
Machine Translate CN105093088A (Year: 2015).*
International Search Report, dated May 31, 2019, for Chongqing Huike Jinyu Optoelectronic Technology Co., Ltd. et al., International Application No. PCT/CN2018/111645, Filed Oct. 24, 2018.
First Office Action in counterpart Chinese Application No. 201811072787.7, dated Sep. 27, 2019.
Second Office Action in counterpart Chinese Application No. 201811072787.7, dated Jun. 15, 2020.
Yang et al., Video Detection Technology, Jul. 2015, pp. 201-202, Chinese People's Public Security University Press, China.

* cited by examiner

TEST ASSEMBLY AND TEST DEVICE

CROSS-REFERENCE TO RELATED APPLICATIONS

This application is the International Application No. PCT/CN2018/111645 for entry into US national phase, with an international filing date of Oct. 24, 2018 designating the U.S., now pending, and claims priority benefits to Chinese Patent Application No. 201811072787.7, filed on Sep. 14, 2018, the contents of which being incorporated herein by reference.

BACKGROUND OF THE INVENTION

Field of the Invention

The present application relates to the technical field of testing technology, and more particularly to a test assembly and a test device.

Description of Related Art

Thin film transistor (TFT) is main drive element in current Liquid Crystal Display (LCD) and Active Matrix Organic light-emitting diode (AMOLED), and directly affect the display performance of a panel display device.

Both the LCD and the AMOLED include a TFT array substrate. Generally, in the product manufacturing stage of the display panel, in order to monitor the characteristic value of the active area (AA) of the display panel product, a plurality of test keys are designed around the large panel of the display panel or around the panel. After a test element group (TEG) is in press contract with those test keys, and then monitoring the contact resistance (RC) characteristic of various kinds of group, such as, a thin film transistor (TFT), a Rs (Line Resistance or Sheet Resistance), a Rc (contact resistance between different conductors), a capacitor and the like. And the existing test element groups are easy to be damaged during test.

BRIEF SUMMARY OF THE INVENTION

An object of the present application is to provide a test assembly, to solve the problem that the test assembly is easy to be damaged during test.

Technical Solutions

In order to solve the above technical problem, the technical solution adopted by an embodiment of the present application is to provide a test assembly configured to be in press contract with a test key disposed around a display panel to detect contact characteristics of the circuit of the display panel, the test assembly includes:

a detection pin, configured to be in press contact and fit with the test key under the action of a driving force, the number of the detection pin is at least one;

a pressure sensor, in connection with a respective detection pin, wherein the pressure sensor is configured to detect a pressure value as applied to the detection pin connected therewith, the pressure sensor is provided with a preset value;

a drive mechanism, in connection with each detection pin and configured to output a driving force to each detection pin to move each detection pin, the drive mechanism includes a first driver in connection with a respective detection pin to move the respective detection pin connected therewith, the pressure sensor connected with the same detection pin as the first driver are in mutual signal connection with the first driver, the first driver is configured to drive the detection pin into press contact with the test key;

in which each pressure sensor is configured to detect the pressure applied to the detection pin connected therewith in real time, and when the pressure of the detection pin detected by the pressure sensor reaches the preset value, the pressure sensor generates a feedback signal and transmits it to the first driver, the first driver responsively stops outputting the driving force to the detection pin.

An embodiment of the present application provides a test assembly including at least one detection pin configured to be in press contact and fit with the test key under the action of a driving force, a pressure sensor in connection with a respective detection pin and configured to detect a pressure value of the detection pin connected therewith, and a drive mechanism in connection with each detection pin and configured to output a driving force to each detection pin to move each detection pin, the drive mechanism includes a first driver in connection with a respective detection pin and configured to move the detection pin connected therewith, when the test key is applied to characteristic detection, the first driver is configured to output a driving force to the detection pin to drive the detection pin to be in press contract with the test key, and in the process, the pressure sensor is configured to detect the pressure applied to the detection pin in real time, when the pressure of the detection pin detected by the pressure sensor reaches the preset value, the pressure sensor is configured to transmit a signal to the first driver, and after the first driver receives the signal, the first driver responsively stops outputting a driving force to the detection pin, and the detection pin stops moving, so that the deformation and damage of the detection pin can be avoided due to excessive pressure during the press contact process of test key, therefore, the detection pin can be reused to save costs, and also to ensure that the pressure applied to the detection pin is consistent each time when the detection pin is in press contract with the test key, and to improve the accuracy of detection of the test key characteristics.

An further object of an embodiment of the present application to provide a test device, configured to detect a contact characteristic of a circuit of a display panel, and including a test assembly configured be in press contract with a test key disposed around the display panel, the test assembly includes:

a detection pin, configured to be in press contact and fit with the test key under the action of a driving force, the number of the detection pin is at least one;

a pressure sensor, in connection with a respective detection pin, wherein the pressure sensor is configured to detect a pressure value as applied to the detection pin connected therewith, the pressure sensor is provided with a preset value;

a drive mechanism, in connection with each detection pin and configured to output a driving force to each detection pin to move each detection pin, the drive mechanism includes a first driver in connection with a respective detection pin to move the respective detection pin connected therewith, the pressure sensor connected with the same detection pin as the first driver are in mutual signal connection with the first driver, the first driver is configured to drive the detection pin into press contact with the test key;

in which each pressure sensor is configured to detect the pressure applied to the detection pin connected therewith in real time, and when the pressure of the detection pin detected by the pressure sensor reaches the preset value, the pressure sensor generates a feedback signal and transmits it to the first driver, the first driver responsively stops outputting the driving force to the detection pin.

In an embodiment of the present application provides a test device including a test assembly, the test assembly includes at least one detection pin configured to be in press contact and fit with the test key under the action of a driving force, a pressure sensor in connection with a respective detection pin and configured to detect a pressure value of the detection pin connected therewith, and a drive mechanism in connection with each detection pin and configured to output a driving force to each detection pin to move each detection pin, the drive mechanism includes a first driver in connection with a respective detection pin and configured to move the detection pin connected therewith, when the test key is applied to characteristic detection, the first driver is configured to output a driving force to the detection pin to drive the detection pin to be in press contract with the test key, and in the process, the pressure sensor is configured to detect the pressure applied to the detection pin in real time, when the pressure of the detection pin detected by the pressure sensor reaches the preset value, the pressure sensor is configured to transmit a signal to the first driver, and after the first driver receives the signal, the first driver responsively stops outputting a driving force to the detection pin, and the detection pin stops moving, so that the deformation and damage of the detection pin can be avoided due to excessive pressure during the press contact process of test key, therefore, the detection pin can be reused to save cost, and also to ensure that the pressure applied to the detection pin is consistent each time when the detection pin is in press contract with the test key, and to improve the accuracy of detection of the test key characteristics.

An further object of an embodiment of the present application to provide a test device, configured to detect a contact characteristic of a circuit of a display panel, and including a test assembly configured be in press contract with a test key disposed around the display panel, the test assembly includes:

a detection pin, configured to be in press contact and fit with the test key under the action of a driving force, the number of the detection pin is at least one;

a pressure sensor, in connection with a respective detection pin, wherein the pressure sensor is configured to detect a pressure value as applied to the detection pin connected therewith, the pressure sensor is provided with a preset value;

a drive mechanism, in connection with each detection pin and configured to output a driving force to each detection pin to move each detection pin, the drive mechanism includes a first driver in connection with a respective detection pin and configured to move the detection pin connected therewith, and a second driver configured to drive the detection pin to access to the test key; the second driver is configured to drive the detection pin to access to the test key in s first direction such that the detection pin reaches above the test key and is aligned, and the first driver is configured to drive the detection pin moving to be in press contract with the test key in a second direction;

the pressure sensors connected with the same detection pin are in mutual signal connection with the first driver, the first driver is configured to drive the detection pin to be in press contract with the test key;

in which each pressure sensor is configured to detect the pressure applied to the detection pin connected therewith in real time, and when the pressure of the detection pin detected by the pressure sensor reaches the preset value, the pressure sensor generates a feedback signal and transmits it to the first driver, the first driver responsively stops outputting the driving force to the detection pin.

In an embodiment of the present application provides a test device including a test assembly, the test assembly includes at least one detection pin configured to be in press contact and fit with the test key under the action of a driving force, a pressure sensor in connection with a respective detection pin and configured to detect a pressure value of the detection pin connected therewith, and a drive mechanism in connection with each detection pin and configured to output a driving force to each detection pin to move each detection pin, the drive mechanism includes a first driver in connection with a respective detection pin and configured to move the detection pin connected therewith, and a second driver configured to drive the detection pin to access to the test key; the second driver is configured to drive the detection pin to access to the test key in s first direction such that the detection pin reaches above the test key and is aligned, and the first driver is configured to drive the detection pin moving to be in press contract with the test key in a second direction; and in the process, the pressure sensor is configured to detect the pressure applied to the detection pin in real time, when the pressure of the detection pin detected by the pressure sensor reaches the preset value, the pressure sensor is configured to transmit a signal to the first driver, and after the first driver receives the signal, the first driver responsively stops outputting a driving force to the detection pin, and the detection pin stops moving, so that the deformation and damage of the detection pin can be avoided due to excessive pressure during the press contact process of test key, therefore, the detection pin can be reused to save cost, and also to ensure that the pressure applied to the detection pin is consistent each time when the detection pin is in press contract with the test key, and to improve the accuracy of detection of the test key characteristics.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

DESCRIPTION OF THE PREFERRED EMBODIMENTS

In order to make the purpose, the technical solution and the advantages of the present application be clearer and more understandable, the present application will be further described in detail below with reference to accompanying figures and embodiments. It should be understood that the specific embodiments described herein are merely intended to illustrate but not to limit the present application.

It is noted that when a component is referred to as being "fixed to" or "disposed at" another component, it can be directly or indirectly on another component. When a component is referred to as being "connected to" another component, it can be directly or indirectly connected to another component. Terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s). In the description of the present application, "a plurality of" means two or more, unless there is additional explicit and specific limitation.

Figure 1:
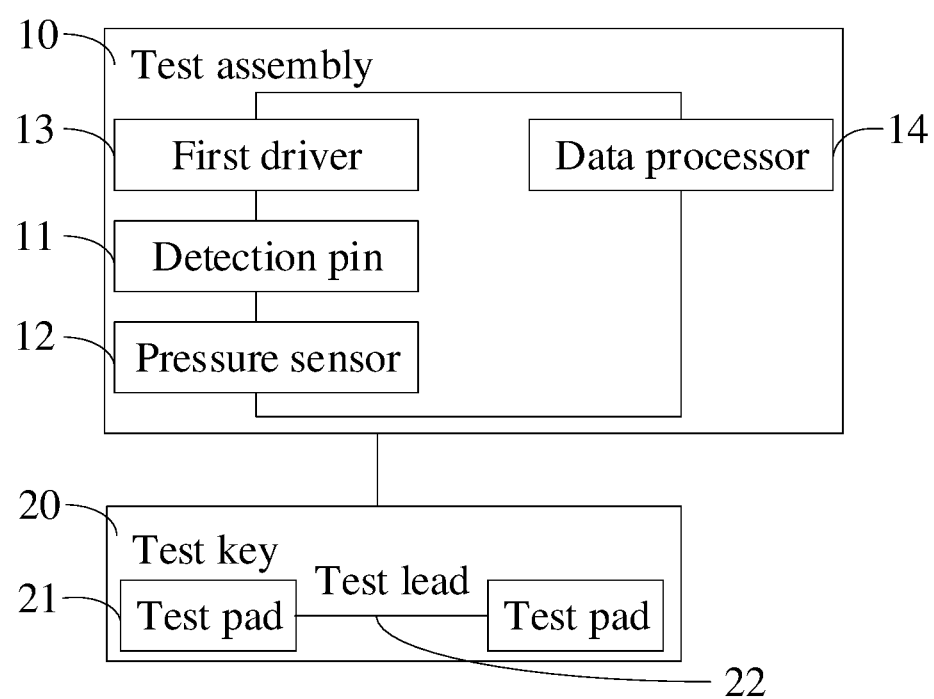
FIG. 1 is a schematic structural diagram of a test assembly provided by an embodiment of the present application.
Figure 2:
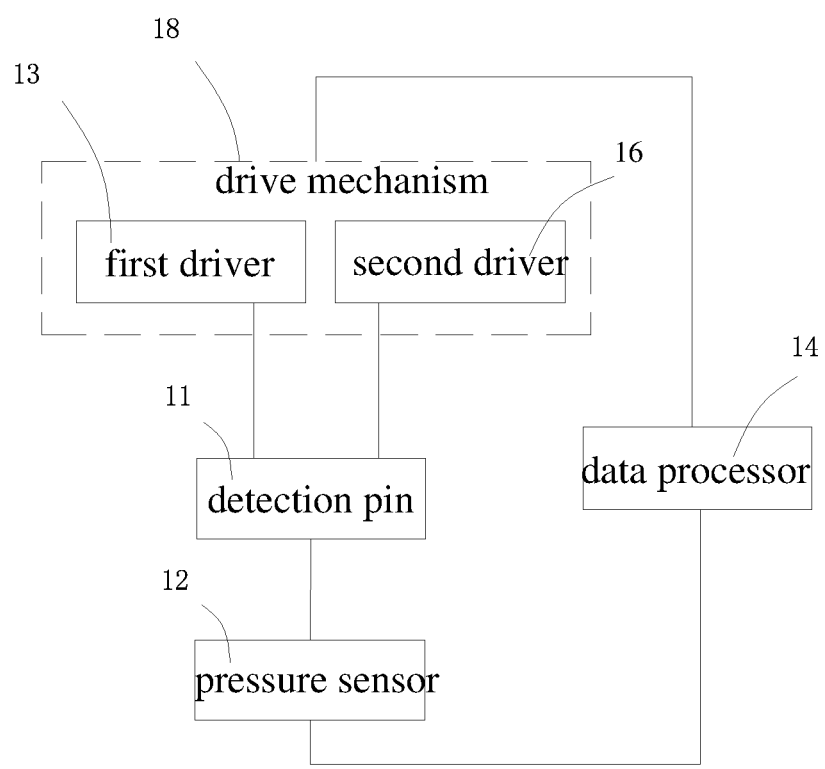
FIG. 2 is a schematic structural diagram of a test assembly provided by an embodiment of the present application.
Figure 3:
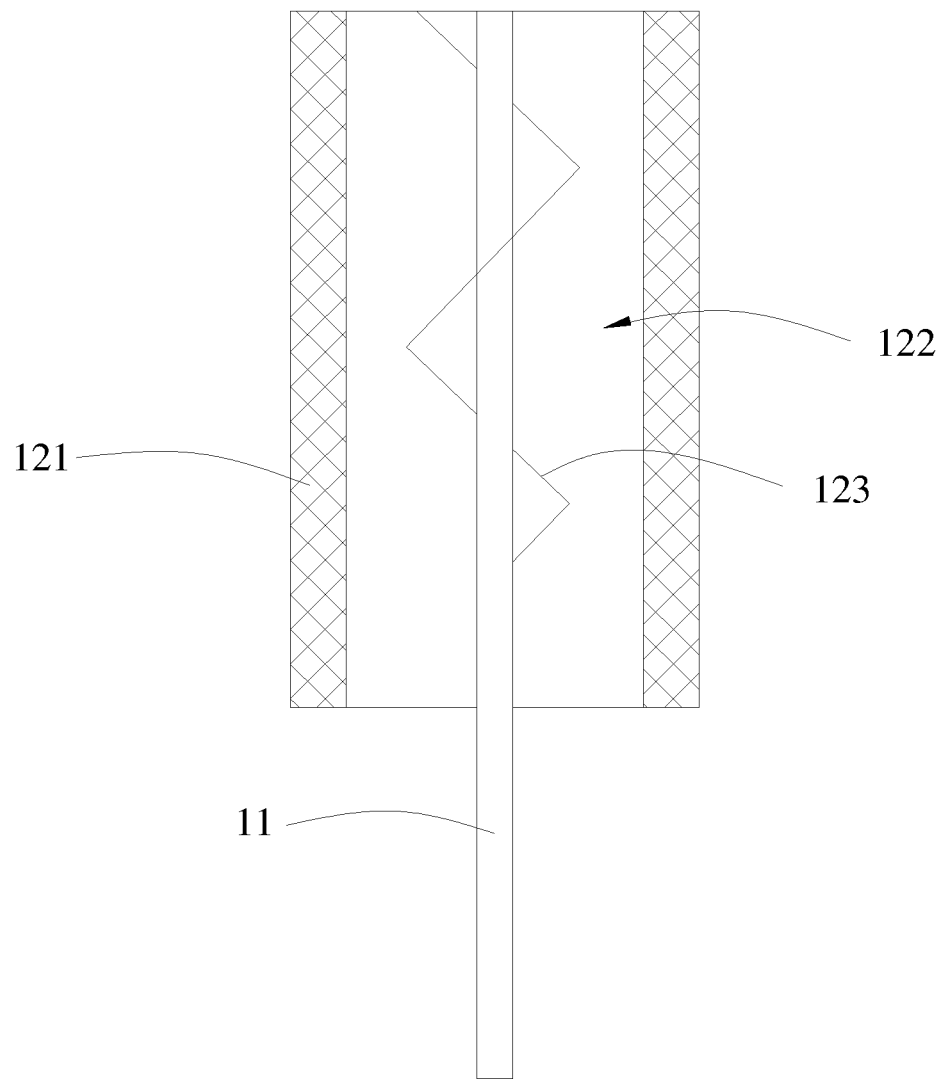
FIG. 3 is a schematic structural view of a pressure sensor and a detection pin.

As shown in FIGS. 1 to 3, the present application provides a test assembly configured to be in press contract with a test key 20 formed around a display panel during a manufacturing stage of the display panel, to detect a contact resistance characteristic of a circuit of the display panel. The display panel is provided with a plurality of test pads 21, each test pads 21 leads a test lead 22, and the test key 20 is formed by connecting test leads 22 between the test pads 21, such as the connection of a test lead 22 of the first test pad 21 and a test lead 22 of the third test pad 21 can form a test key 20, and the connection of a test lead 22 of the second test pad 21 and a test lead 22 of the fourth test pad 21 can form a test key 20. More test keys 20 can be formed depending on the test needs and the display panel structure. The test key 20 is formed in an inactive area around the display panel.

The test assembly includes at least one detection pin 11 configured to be in press contact and fit with the test key 20 under the action of a driving force, a pressure sensor 12 in connection with a respective detection pin 11, the pressure sensor 12 is configured to detect a pressure value applied to the detection pin 11 connected therewith, the test assembly further includes a drive mechanism 18 in connection with each detection pin 11 and configured to output a driving force to each detection pin 11 to move each detection pin, the drive mechanism 18 includes a first driver 13 in connection with a respective detection pin 11 and configured to move the detection pin 11 connected therewith, the pressure sensors 12 connected with the same detection pin 11 are mutually connected to the first driver 13 via a signal. The pressure sensor 12 has preset value, the first driver 13 drives the detection pin 11 to be in press contract with the test key 20, each pressure sensor 12 is configured to detect the pressure applied to the detection pin 11 connected therewith in real time, and when the pressure of the detection pin 11 detected by the pressure sensor 12 reaches the preset value, the pressure sensor 12 generates a feedback signal and transmits it to the first driver 13, the first driver 13 stops outputting a driving force to the detection pin 11.

In this embodiment, the test assembly includes at least one detection pin 11 configured to be in press contact and fit with the test key 20 under the action of a driving force, a pressure sensor 12 in connection with a respective detection pin 11 and configured to detect a pressure value of the detection pin 11 connected therewith, and a drive mechanism 18 in connection with each detection pin 11 and configured to output a driving force to each detection pin 11 to move each detection pin 11, the drive mechanism 18 includes a first driver 13 in connection with a respective detection pin 11 and configured to move the detection pin 11 connected therewith, when the test key 20 is applied to characteristic detection, the first driver 13 is configured to output a driving force to the detection pin 11 to drive the detection pin 11 to be in press contract with the test key 20, and in the process, the pressure sensor 12 is configured to detect the pressure applied to the detection pin 11 in real time, when the pressure of the detection pin 11 detected by the pressure sensor 12 reaches the preset value, the pressure sensor 12 is configured to transmit a signal to the first driver, and after the first driver 13 receives the signal, the first driver 13 responsive stops outputting a driving force to the detection pin 11, and the detection pin 11 stops moving, so that the deformation and damage of the detection pin 11 can be avoided due to excessive pressure during the press contact process of test key 20, therefore, the detection pin 11 can be reused to save cost, and also to ensure that the pressure applied to the detection pin 11 is consistent each time when the detection pin 11 is in press contract with the test key 20, and to improve the accuracy of detection of the test key 20 characteristics.

Further, the transmission of the stop signal to the first driver 13 by the pressure sensor 12 can be implemented like this: the test assembly further includes a data processor 14 configured to be in signal connection with each pressure sensor 12, each first driver 13 is in signal connection with the data processor 14, and the pressure sensors 12 connected with the same detection pin 11 are in mutual signal connection with the first driver 13 and the data processor 14, when the pressure of the detection pin 11 detected by the pressure sensor 12 reaches the preset value, the pressure sensor 12 generates a feedback signal and transmits it to the data processor 14, the data processor 14 receives the feedback signal of the pressure sensor 12 to generate a control signal, and the data processor 14 transmits the control signal to the first driver 13, and after the first driver 13 receives the control signal, the first driver 13 stops outputting a driving force to the detection pin 11.

In this embodiment, when the pressure of the detection pin 11 detected by the pressure sensor 12 reaches the preset value, since each pressure sensor 12 is in signal connection with the data processor 14, therefore, the pressure sensor 12 can generate a feedback signal and transmits it to the data processor 14, and each first driver 13 is connected to the data processor 14, and the data processor 14 receives the feedback signal from the pressure sensor 12 to generate a control signal, and the data processor 14 transmits the control signal to the first driver 13 causes the first driver 13 to stop operation, further causes the detection pin 11 to stop moving, so that the deformation and damage of the detection pin 11 can be avoided due to excessive pressure during the press contact process of test key 20, therefore, the detection pin can be reused and the purpose of cost saving can be achieved.

Further, the test assembly further includes a carrier configured to mount each detection pin 11, the drive mechanism 18 further includes a second driver 16 connected to the carrier and driving the carrier to move the detection pin 11 to access to the test key 20. As shown in FIG. 2.

In this embodiment, the number of the carriers may be one or more, and each detection pin 11 is movably mounted at the carrier.

In an embodiment, the second driver 16 and the first driver 13 may be arranged to drive the carrier and the detection pin 11 in different directions. The number of the carriers may be one, and the second driver 16 drives the one carrier to move to drive the detection pins 11 in a first direction. The first driver 13 is in one-to-one correspondence with each detection pin 11, after the second driver 16 drives the carrier to move above the test key 20, each first driver 13 drives the corresponding detection pin 11 to move in a second direction to be in press contract with the test key 20.

Specifically, the second driver 16 is configured to drive the carrier and each detection pin 11 to gradually approach the test key 20 in the first direction, such as reaching above the test key 20 and aligning, and then the first driver 13 drives each detection pin 11 to move in the second direction until to be in press contract with the test key 20. The first direction is perpendicular to the second direction.

Since the second driver 16 is arranged to drive the carrier and the detection pins 11 to move in the first direction and to reach above and align the test key 20, the speed of the second driver 16 driving the carrier can be greater than the speed of the first driver 13 driving the detection pin 11, This is advantageous in improving the detection efficiency and does not causing damage to the detection pin 11.

While at a third direction perpendicular to the plane determined by the first direction and the second direction, the alignment between the detection pin 11 and the test key 20 is determined by the position between the test assembly itself and the test key 20, which can be easily determined by a relative positioning between the test assembly itself and the display panel to be tested or a slab of the display panel, or a slide rail of the third direction whose movement direction is perpendicular to both the first direction and the second direction is set on the frame for the carrier to move in the first direction and the third direction. There is no longer a limit here.

In an embodiment, the test assembly further includes a frame, the carrier being slidably mounted to the frame. During the first driver drives the carrier to move, the carrier approaches a test piece in a manner that slides in the first direction on the frame.

In an embodiment, the number of carriers is plural and corresponds one-to-one with the detection pins 11, and both the second driver 16 and the first driver 13 are arranged to drive the carrier and the detection pin 11 in a three dimensions.

The second driver 16 drives each carrier and the detection pins to move in the first direction, the second direction and the third direction and approach to the test key 20, in which the second direction is a direction perpendicular to the plane of the test key 20, that is, the direction that the detection pin 11 is in press contract with the plane of the test key 20, and in the second direction, the detection pin 11 is applied to pressure. The first direction, the third direction and the second direction are perpendicular to each other. Then, the first driver 13 continues to move in the first direction, the second direction, and the third direction to completely contact with the test key 20.

Since the driving of the first driver 13 enables the press contact between the detection pin 11 and the test key 20, the control accuracy of the first driver 13 is higher than the control accuracy of the second driver 16, so that the relative distance in the second direction between the detection pin 11 and the test key 20 can be more accurately controlled, and the pressure between the detection pin 11 and the test key 20 is prevented from being excessive or too small, and the damage of the detection pin 11 is avoided to ensure the detection accuracy.

Specifically, the control accuracy of the first driver 13 may be 5 micrometers, that is, the detection pin 11 may be driven to access to the test key 20 with a step distance of at least 5 micrometers. The control accuracy of the second driver 16 may be 10 micrometers or more, such as 10 micrometers, 20 micrometers, etc., and which is not limited herein.

In this embodiment, each detection pin 11 is mounted at the carrier. During the process of detecting the test key 20, firstly, the second driver 16 drives the carrier to quickly approach the test key 20, in the process, the carrier drives the detection pin 11 to access to the test key 20, and then the first driver 13 drives the detection pin 11 in press contract with the test key 20 to test. The second driver 16 can improve the efficiency of the detection, and the first driver 13 can realize high-precision control, thereby preventing the detection pin 11 from being bent and deformed due to excessive pressure during the press contact process of test key 20, so that the detection pin 11 can be reused, which can save costs.

In this embodiment, the test assembly further includes a frame; the carrier approaches a test piece in a manner that slides in the first direction, the second direction, and the third direction on the frame.

Further, the test assembly further includes a camera in signal connection with the data processor 14 and configured to acquire a distance between each detection pin 11 and the test key 20 in a first direction, and the second driver 16 connects to the data processor 14 by controlling, the data processor 14 can also provide a standard value of the distance. The camera takes images of the detection pin 11 and the test key 20 and transmits the images to the data processor 14, a distance information between the detection pin 11 and the test key 20 can be obtained by analyzing the images, and the data processor 14 compares the distance information between the detection pin 11 and the test key 20 with the standard value to judge whether it is necessary to control the second driver 16 to stop operation, in which the second driver 16 continues to work when the distance between the detection pin 11 and the test key 20 is greater than a standard value, and the second driver 16 stops working when the distance between the detection pin 11 and the test key 20 is less than or equal to the standard value.

In an embodiment, the standard value is set to 20 micrometers, and when the distance between the detection pin 11 and the test key 20 in the second direction is less than or equal to 20 micrometers, it indicates that the detection pin 11 has reached the minimum distance to the test key 20. At this time, the movement of the smaller step distance should be changed to be driven by the first driver 13.

In an embodiment, the standard value is set to 10 micrometers, and the distance between the detection pin 11 and the test key 20 can be further precisely controlled.

The camera may be a Charge Coupled Device (CCD) camera or a Complementary Metal Oxide Semiconductor (CMOS) camera, which is not limited herein.

In this embodiment, the second driver 16 drives the carrier to access to the test key 20, and the carrier drives the detection pin 11 to access to the test key 20, in the process, the camera acquires the images of the detection pin 11 and the test key 20 in real time, and transmits the images to the data processor 14, the data processor 14 analyzes the images to obtain the distance information between the detection pin 11 and the test key 20, and the data processor 14 compares the distance information between the detection pin 11 and the test key 20 with the standard value to judge whether it is necessary to control the second driver 16 to stop operation, in which the second driver 16 continues to work when the distance between the detection pin 11 and the test key 20 is greater than a standard value, and the second driver 16 stops working when the distance between the detection pin 11 and the test key 20 is less than or equal to the standard value, and thus, it is possible to prevent the detection pin 11 from being bent and deformed due to the collision of the detection pin 11 with the test key 20.

Further, as shown in FIG. 3, the pressure sensor 12 includes a housing 121 formed with a mounting cavity 122, a pressure elastic member 123 mounted in the mounting cavity 122, and a signal converter connected to the pressure elastic member 123 and configured to convert the force signal into electrical signal, one end of the detection pin 11 is installed into the mounting cavity 122, and the other end is exposed outside the mounting cavity 122 to be in press contract with the test key 20, and one end of the pressure elastic member 123 is fixed in the mounting cavity 122 of the housing 121, the other end of the pressure elastic member 123 is fixed to one end of the detection pin 11 in the mounting cavity 122, so that the detection pin 11 can slide inside the mounting cavity 122, and the sliding connection of the detection pin 11 and the housing 121 is realized. When the detection pin 11 is in press contract with the test key 20, the detection pin 11 is compressed back into the mounting cavity 122. The length of the detection pin 11 is compressed back into the mounting cavity 122, that is, the degree that the pressure elastic member 123 is compressed indicates the magnitude of the pressure between the detection pin 11 and the test key 20, and the degree that the pressure elastic member 123 is compressed can be converted to a pressure value by a signal converter for visual representation.

In the present embodiment, the signal converter is in signal connection with the data processor 14, and the pressure elastic member 123 can be connected to the signal converter, and the deformation of the pressure elastic member 123 is sensed by the signal converter to sense the pressure, and the pressure of the detection pin 11 is transmitted to the data processor 14 in the form of a feedback signal.

For the case where the number of the carrier is one, the driving of the detection pins 11 by the first driver 13 can be realized by the housing 121, that is, the first driver 13 drives the housings 121 to drive the movements of the detection pins 11 and senses the pressure applied to the detection pins 11. When the carrier drives the detection pins 11 to reach above the test key 20 in the first direction, each housing 121 can slide in the second direction on the carrier, so that each detection pin 11 is in press contract with the test keys 20 via the housing 121.

Other embodiments of the present application further provide a test device configured to monitor contact characteristics of various assemblies at a manufacturing stage, such as a thin film transistor, a line resistance, a surface resistance, a contact resistance between different conductors, a capacitor, and the like in a circuit of a display panel. The test device includes the test assembly described above.

The aforementioned embodiments are only specific embodiments of the present application, and should not be regarded as being limitation to the present application, any modification, equivalent replacement, improvement, and so on, which are made within the spirit and the principle of the present application, should be included in the protection scope of the present application.

What is claimed is:

1. A test assembly, configured to be in press contact with a test key disposed around a display panel to detect contact characteristics of the circuit of the display panel, wherein the test key is formed by connecting test leads between test pads of the display panel, and the test key is formed in an inactive area around the display panel, wherein the test assembly comprises:

a detection pin, configured to be in press contact and fit with the test key under the action of a driving force, wherein the number of the detection pin is at least one;

a pressure sensor, in connection with a respective detection pin, wherein the pressure sensor is configured to detect a pressure value as applied to the detection pin connected therewith, wherein the pressure sensor is provided with a preset value;

a drive mechanism, in connection with each detection pin and configured to output a driving force to each detection pin to move each detection pin, the drive mechanism comprises a first driver in connection with a respective detection pin to move the respective detection pin connected therewith, the pressure sensor connected with the same detection pin as the first driver are in mutual signal connection with the first driver, wherein the first driver is configured to drive the detection pin into press contact with the test key;

wherein each pressure sensor is configured to detect the pressure applied to the detection pin connected therewith in real time, and when the pressure of the detection pin detected by the pressure sensor reaches the preset value, the pressure sensor generates a feedback signal and transmits it to the first driver, the first driver responsively stops outputting the driving force to the detection pin;

wherein the test assembly further comprises: a carrier, configured to mount each detection pin thereto;

wherein the drive mechanism further comprises: a second driver connected to the carrier and configured to drive the carrier to move for the access of detection pin to the test key, the second driver is configured to drive the carrier to access to the test key in three dimensions such that the detection pin reaches above the test key and is aligned therewith;

wherein the first driver is configured to drive the detection pin to move into press contact with the test key in three dimensions; and wherein the test assembly further comprises:

a camera, configured to be in signal connection with the data processor and configured to acquire a distance between each detection pin and the test key, the second driver is connected to the data processor, and the camera is configured to take images of the detection pin and the test key and transmits the images to the data processor, the data processor is configured to analyze the images to obtain a distance information between the detection pin and the test key in the second direction, and the data processor is configured to compare the information of the distance between the detection pin and the test key with a standard value to determine whether it is necessary to control the second driver to stop operation; wherein the second direction is a direction perpendicular to a plane of the test key.

2. The test assembly of claim 1, wherein the camera comprises a charge coupled device camera or a complementary metal oxide semiconductor camera.

3. The test assembly of claim 1, wherein the standard value is 10 micrometers or 20 micrometers.

* * * * *